United States Patent
Chang et al.

(10) Patent No.: US 11,678,454 B2
(45) Date of Patent: Jun. 13, 2023

(54) MODULAR FLOATING MECHANISM DESIGN FOR CABLE BLIND MATING AT SERVER INFRASTRUCTURE

(71) Applicant: DELL PRODUCTS L.P., Round Rock, TX (US)

(72) Inventors: Chih Hsien Chang, Taipei (TW); Yi Chang Chen, New Taipei (TW)

(73) Assignee: DELL PRODUCTS L.P., Round Rock, TX (US)

( * ) Notice: Subject to any disclaimer, the term of this patent is extended or adjusted under 35 U.S.C. 154(b) by 0 days.

(21) Appl. No.: 16/938,246

(22) Filed: Jul. 24, 2020

(65) Prior Publication Data

US 2020/0359518 A1 Nov. 12, 2020

Related U.S. Application Data

(63) Continuation of application No. 16/159,846, filed on Oct. 15, 2018, now Pat. No. 10,743,433.

(51) Int. Cl.
*H05K 7/14* (2006.01)

(52) U.S. Cl.
CPC .......... *H05K 7/1401* (2013.01); *H05K 7/142* (2013.01); *H05K 7/1489* (2013.01); *H05K 7/1491* (2013.01)

(58) Field of Classification Search
CPC .... H05K 7/1491; H05K 7/1498; H05K 7/142; H05K 7/1401
See application file for complete search history.

(56) References Cited

U.S. PATENT DOCUMENTS

| | | | | |
|---|---|---|---|---|
| 3,488,623 | A * | 1/1970 | Stiller | H01R 13/631 439/352 |
| 5,267,769 | A | 12/1993 | Bonné et al. | |
| 6,024,338 | A * | 2/2000 | Koike | F16F 15/08 248/638 |
| 6,125,097 | A * | 9/2000 | Wu | G11B 33/08 |
| 6,456,062 | B2 | 9/2002 | Yamashita et al. | |
| 6,590,383 | B2 | 7/2003 | Yamashita et al. | |
| 6,724,636 | B2 | 4/2004 | Yamamoto et al. | |
| 6,823,527 | B2 * | 11/2004 | Liao | G11B 33/08 |
| 6,837,755 | B1 * | 1/2005 | Kitajima | H01R 43/205 439/830 |
| 6,883,175 | B2 * | 4/2005 | Liao | G11B 33/08 720/694 |
| 7,059,882 | B2 * | 6/2006 | Sugita | H01R 13/6315 439/247 |
| 7,243,359 | B2 * | 7/2007 | Saito | G11B 33/08 |
| 7,294,010 | B1 * | 11/2007 | Shaikh | H01R 13/629 439/247 |

(Continued)

*Primary Examiner* — Abhishek M Rathod
*Assistant Examiner* — Keith DePew
(74) *Attorney, Agent, or Firm* — Jackson Walker LLP; Christopher J. Rourk

(57) ABSTRACT

An apparatus is disclosed that comprises a first structure configured to be connected to a chassis, a second structure configured to be attached to the first structure, the second structure including at least one first connector and a damper disposed between the first structure and the second structure, the damper configured to allow the second structure to move in one dimension relative to the first structure when the first connector is moved in a direction to be coupled to a second connector that is not aligned with the first connector.

18 Claims, 3 Drawing Sheets

(56) References Cited

U.S. PATENT DOCUMENTS

| | | | |
|---|---|---|---|
| 7,400,161 B2* | 7/2008 | Saito | G01R 31/2893 |
| | | | 324/757.04 |
| 7,909,583 B2 | 3/2011 | Sugimoto et al. | |
| 8,098,042 B2 | 1/2012 | Nakayama et al. | |
| 8,342,867 B2* | 1/2013 | Murphy | G01Q 10/065 |
| | | | 439/248 |
| 8,908,327 B1* | 12/2014 | Li | G11B 33/08 |
| | | | 360/99.17 |
| 9,058,849 B2* | 6/2015 | Lin | G11B 33/08 |
| 9,169,893 B2* | 10/2015 | Williamson | E02D 3/046 |
| 9,207,709 B2* | 12/2015 | Xie | G06F 1/16 |
| 9,337,577 B1* | 5/2016 | Hitchcock | H01R 13/6315 |
| 9,520,158 B1* | 12/2016 | Lyu | G11B 33/124 |
| 9,539,686 B2 | 1/2017 | Tanaka | |
| 9,614,325 B2* | 4/2017 | Yuan | H01R 13/665 |
| 9,620,900 B2 | 4/2017 | Yanase et al. | |
| 9,905,968 B2 | 2/2018 | Yanase et al. | |
| 10,069,246 B1 | 9/2018 | Moritake et al. | |
| 10,732,670 B2 | 8/2020 | Usuda | |
| 2002/0081881 A1* | 6/2002 | Komenda | H01R 13/6315 |
| | | | 439/247 |
| 2003/0012120 A1* | 1/2003 | Chen | G11B 33/08 |
| 2006/0141836 A1* | 6/2006 | Van Der Mee | H01R 13/6315 |
| | | | 439/247 |
| 2006/0294533 A1* | 12/2006 | Wu | G11B 33/08 |
| 2009/0068870 A1* | 3/2009 | Mezhinsky | G02B 6/3897 |
| | | | 439/247 |
| 2010/0243855 A1* | 9/2010 | Sampson | F16L 3/22 |
| | | | 248/534 |
| 2013/0033813 A1* | 2/2013 | Ling | G11B 33/124 |
| | | | 361/679.34 |
| 2013/0243526 A1* | 9/2013 | Williamson | A47L 11/12 |
| | | | 405/271 |
| 2014/0110546 A1* | 4/2014 | Senatori | G06F 1/186 |
| | | | 248/220.21 |
| 2015/0116864 A1* | 4/2015 | Lin | G11B 33/142 |
| | | | 360/97.13 |
| 2016/0108987 A1* | 4/2016 | Williamson | A47L 11/4072 |
| | | | 15/98 |
| 2016/0150685 A1* | 5/2016 | Kurita | H05K 9/0016 |
| | | | 174/384 |
| 2017/0245386 A1* | 8/2017 | Park | H01R 12/75 |
| 2018/0145427 A1* | 5/2018 | Otsu | H01R 4/48 |
| 2018/0180135 A1* | 6/2018 | Nydam | B62D 24/02 |
| 2018/0231794 A1* | 8/2018 | De Beule | G02B 27/646 |
| 2019/0032740 A1* | 1/2019 | Kashihara | F16F 1/371 |
| 2019/0256348 A1* | 8/2019 | Mitchell | B81B 7/0016 |

* cited by examiner

US 11,678,454 B2

MODULAR FLOATING MECHANISM DESIGN FOR CABLE BLIND MATING AT SERVER INFRASTRUCTURE

CROSS-REFERENCE TO RELATED APPLICATIONS

The present application is a continuation of U.S. patent application Ser. No. 16/159,846 filed Oct. 15, 2018, which is hereby incorporated by reference for all purposes as if set forth herein in its entirety.

TECHNICAL FIELD

The present disclosure relates generally to modular components, and more specifically to a modular floating mechanism for cable blind mating within a server infrastructure.

BACKGROUND OF THE INVENTION

Servers are fabricated from a plurality of physical components, including panels, structural components, cables and plugs. Due to the large number of different components and the difficulty in controlling tolerances, it is often necessary to provide non-optimized cable connectors with excess cable to accommodate mating cable plugs, which results in wasted space and materials.

SUMMARY OF THE INVENTION

An apparatus is disclosed that includes a first structure configured to be connected to a chassis, such as a modular support, and a second structure configured to be attached to the first structure, such as a plug and cable assembly. One or more dampers are disposed between the first structure and the second structure, the damper configured to allow the second structure to move in one dimension relative to the first structure when the plug is moved in a direction to be coupled to a mating plug that is not aligned with the plug.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings may be to scale, but emphasis is placed upon clearly illustrating the principles of the present disclosure. Moreover, in the drawings, like reference numerals designate corresponding parts throughout the several views, and in which.

DETAILED DESCRIPTION OF THE INVENTION

Figure 1:
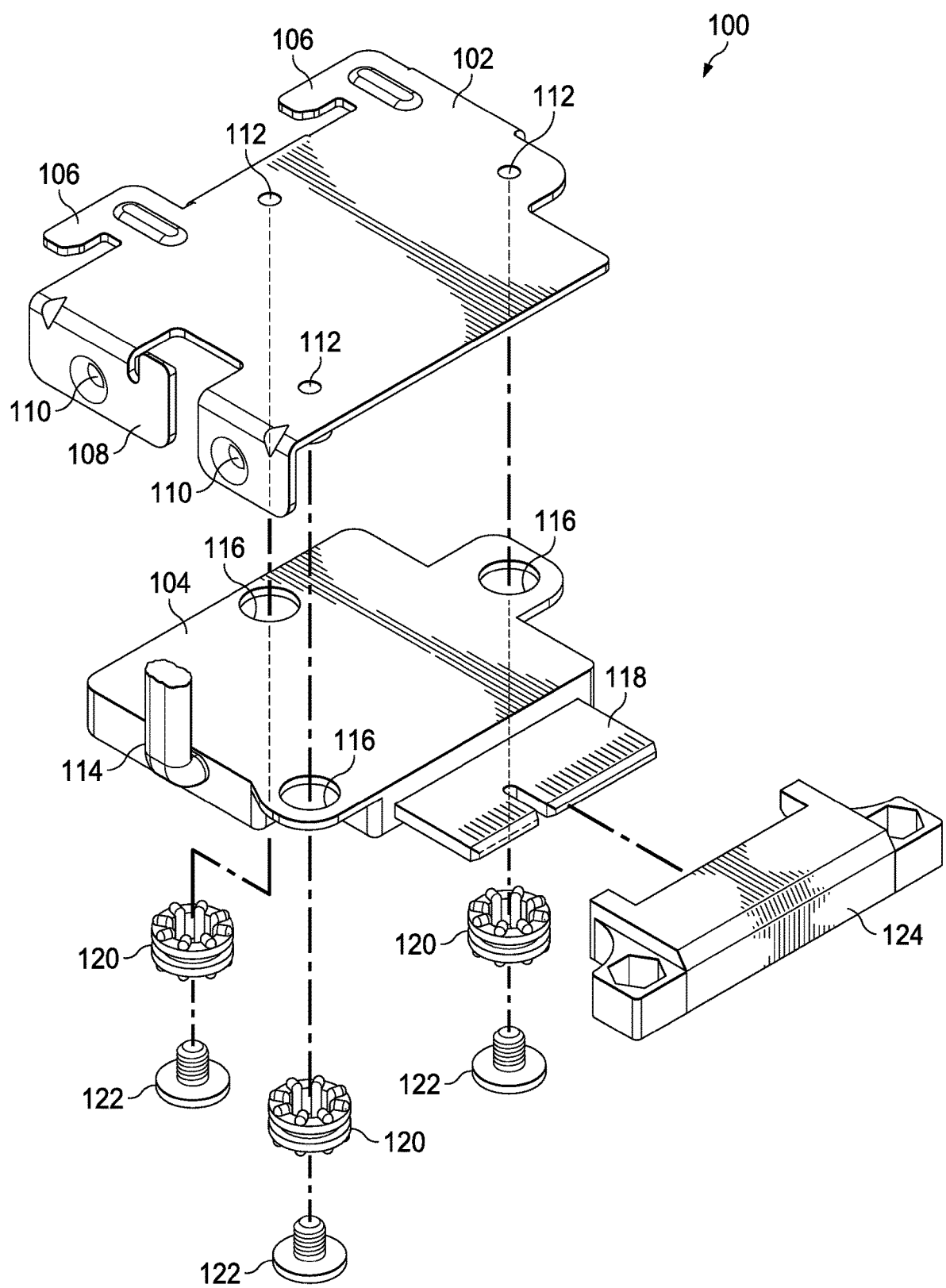
FIG. 1 is a diagram of a mechanism for connecting a cable to an electrical system, in accordance with an example embodiment of the present disclosure.

In the description that follows, like parts are marked throughout the specification and drawings with the same reference numerals. The drawing figures may be to scale and certain components can be shown in generalized or schematic form and identified by commercial designations in the interest of clarity and conciseness.

Removable system components frequently include an additional length of cable length to accommodate a blind mating connection. While a guide pin or other similar device can sometimes be provided on a chassis to facilitate connector mating, modular system components can either prevent the use of such devices or result in configurations where the devices are not accessible. The present disclosure relates to a modular floating cable connector that facilitates cable/connector engagement without a guiding pin to accommodate variations in the cable/connector offset. A customized bracket for the modular floating cable connector provides additional flexibility for accommodating different designs and allows cable routing to be optimized for improved factory manufacturing and service.

In one example embodiment, a "floating" feature is provided between a support and a cable connector that can mitigate the effects of misalignment and accommodate connector offsets arising from manufacturing tolerances and assembly variances. A "customized bracket" is also disclosed that provides for better pre-alignment of a cable position, to facilitate blind mating and better cable routing for factory assembly and service.

FIG. 1 is a diagram of a mechanism 100 for connecting a cable to an electrical system, in accordance with an example embodiment of the present disclosure. Mechanism 100 can be fabricated from compression molded plastic, injection molded plastic, metal or other suitable materials.

Mechanism 100 includes customized bracket 102 and cable connector 104. In one example embodiment, customized bracket 102 can be one of a number of different customized brackets that are compatible with cable connector 104, so as to allow cable connector 104 to be used for a number of different designs and in a number of different locations.

Customized bracket 102 includes hooks 106, which are configured to allow customized bracket 102 to be attached to a side panel or other suitable assembly. Tab 108 includes bolt holes 110, which allow tab 108 to be bolted to a side panel or other suitable assembly. Bolt holes 112 are also provided to connect to damper bolts 122.

Cable connector 104 includes cable 114 and plug 118, which is configured to be inserted into plug receptacle 124. Bolt holes 116 are configured to receive damper bolts 122, which are inserted through dampers 120 and which can be coupled to a bolt (not explicitly shown) or threaded bolt holes 112.

In operation, mechanism 100 can be assembled by inserting each of damper bolts 122 through a corresponding damper 120, bolt hole 116 and bolt hole 112, and then securing the assembly of mechanism 100 by applying a torque to damper bolts 122 to drive them into threads on bolt holes 112, into a bolt nut, or by otherwise securing damper bolts 122 into position, such as by using a locking key structure or other suitable structures. Likewise, other suitable connectors can be used to assemble mechanism 100, such as welds, rivets, lock pins and so forth. Mechanism is then coupled to a chassis or other suitable assembly by sliding hooks 106 into mating slots (not explicitly shown) of a first panel or structure, and by bolting tab 108 to a second panel or structure, such as on a door. When the door is closed or the panel is installed into position, plug 118 can be inserted into a receptacle that is not exactly aligned, and dampers 120 can allow plug 118 to move so as to align with the receptacle. Dampers 120 allow movement in a single axis, which can be an axis that is most susceptible to misalignment, or additional dampers can be added in other axes to provide additional alignment capability.

Figure 2A:
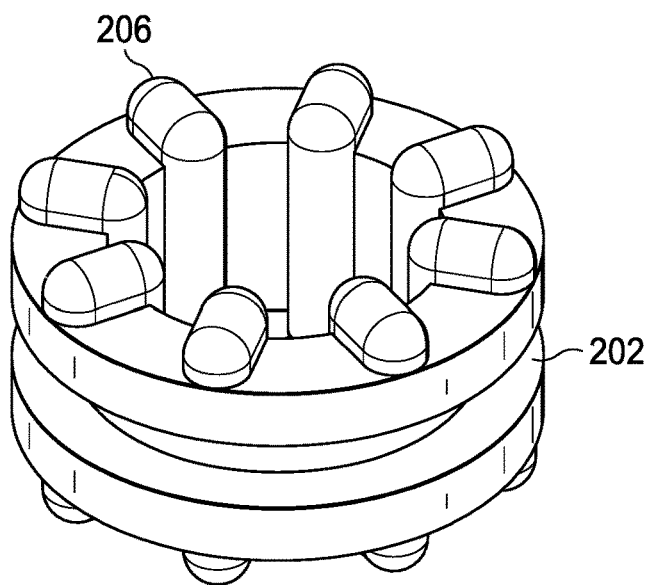
FIGS. 2A through 2C are diagrams of a damper for use with a mechanism for connecting a cable to an electrical system, in accordance with an example embodiment of the present disclosure.
Figure 2B:
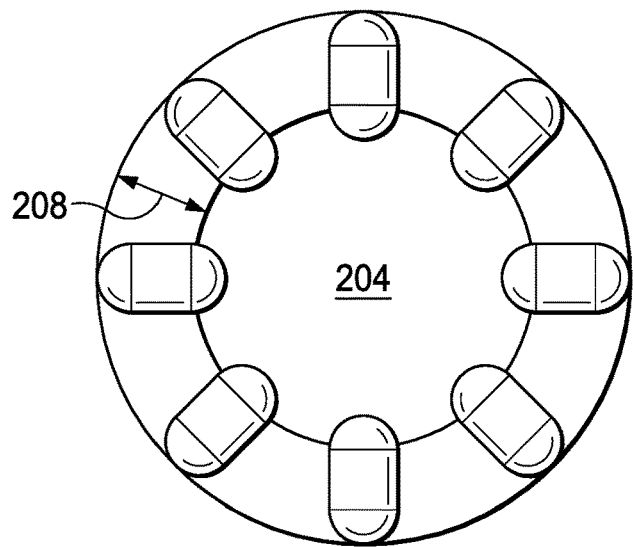
Figure 2C:
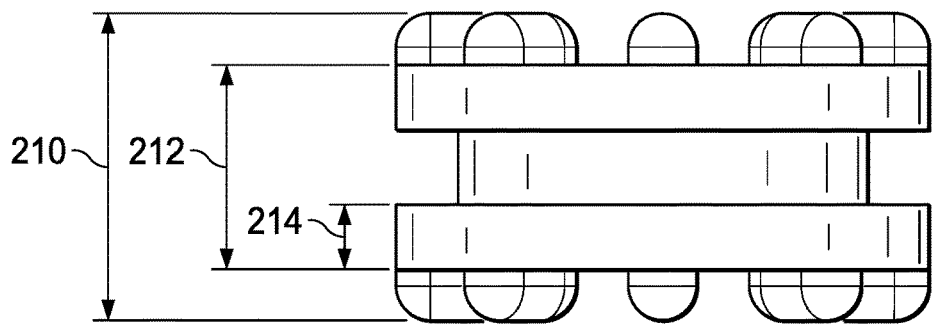

FIGS. 2A through 2C are diagrams of a damper 200 for use with mechanism 100 for connecting a cable to an electrical system, in accordance with an example embodiment of the present disclosure. Damper 200 can be fabricated from foam rubber, foam latex, polyurethane, mechanical springs or other suitable materials, Damper 200 includes a spacer element 202 that can support a circuit board or other suitable structural member that requires freedom of movement in one or more dimensions. The inner diameter 204 and thickness 208 of damper 200 can be selected as a function of the material properties of the material that damper 200 is formed from, to allow the circuit board or other element disposed in spacer element 202 of damper 200 to move in the axial dimension damper 200 by an amount sufficient to accommodate the movement tolerance of the circuit board or other element. Likewise, the shape and number of axial spacers 206, the total thickness 210, the partial thickness 212 and the ledge thickness 214 can also or alternatively be selected as a function of the properties of the material used to form damper 200 and the amount of movement that damper 200 needs to accommodate.

In general damper 200 is a circular structure with an axial penetration, and includes a plurality of axial spacers 206. The spacer element 202 that is configured to support a circuit board includes first and second circular structures, each with an axial penetration and a first diameter, and a third circular structure disposed between the first and second circular structures with an axial penetration and a second diameter that is different from the first diameter.

Figure 3:
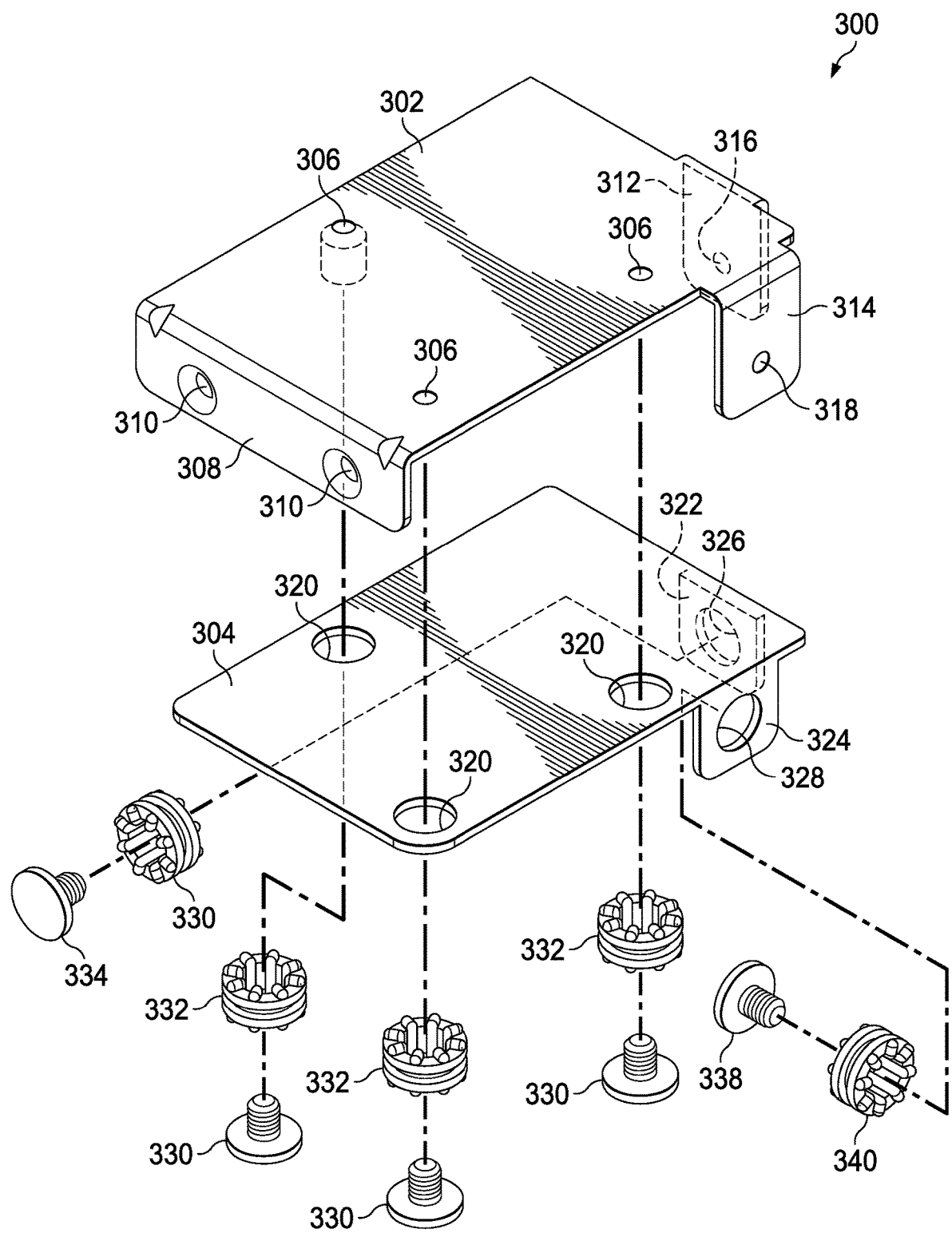
FIG. 3 is a diagram of a mechanism for providing three dimensions of movement for a cable connection, in accordance with an example embodiment of the present disclosure.

FIG. 3 is a diagram of a mechanism 300 for providing three dimensions of movement for a cable connection, in accordance with an example embodiment of the present disclosure. Mechanism 300 can be fabricated from compression molded plastic, injection molded plastic, metal or other suitable materials.

Mechanism 300 includes customized bracket 302 and cable connector 304. In one example embodiment, customized bracket 302 can be one of a number of different customized brackets that are compatible with cable connector 304, so as to allow cable connector 304 to be used for a number of different designs and in a number of different locations.

Customized bracket 302 includes tabs 308, 312 and 314. Tab 308 includes bolt holes 310, which allow tab 308 to be bolted to a side panel or other suitable assembly. Tabs 312 and 314 include bolt holes 318 and 316, respectively, and couple to damper bolts 338 and 334, respectively. Bolt holes 306 are also provided to connect to damper bolts 330.

Cable connector 304 can include a cable such as cable 114 and a plug such as plug 118, although these are not explicitly shown in FIG. 3, and which can be configured to allow the plug to be inserted into a plug receptacle (not explicitly shown). Bolt holes 320, 322 and 328 are configured to receive damper bolts 330, 334 and 338, which are inserted through dampers 332, 336 and 340, respectively, and which can be coupled to a bolt (not explicitly shown) or threaded bolt holes.

In operation, mechanism 300 can be assembled by inserting each of damper bolts 330, 334 and 338 through a corresponding damper 332, 336 and 340, respectively, bolt holes 330, 322 and 328 respectively and bolt holes 306, 318 and 316, respectively, and then securing the assembly of mechanism 300 by applying a torque to damper bolts 330, 334 and 338 to drive them into threads on bolt holes 306, 318 and 316, into a bolt nut, or by otherwise securing damper bolts 330, 334 and 338 into position, such as by using a locking key structure or other suitable structures. Likewise, other suitable connectors can be used to assemble mechanism 300, such as welds, rivets, lock pins and so forth. Mechanism 300 is then coupled to a chassis or other suitable assembly, panel or structure, such as on a door. When the door is closed or the panel is installed into position, the plug can be inserted into a receptacle that is not exactly aligned, and dampers 332, 336 and 340 can allow the plug to move so as to align with the receptacle. Dampers 332, 336 and 340 allow movement in three axes.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. An apparatus comprising:
   a first structure;
   a second structure;
   a circular damper within a penetration of the second structure, wherein the second structure fits within a first spacer of the circular damper;
   a plurality of second spacers disposed axially through a penetration of the circular damper and radially on the damper;
   a bolt disposed in the penetration of the circular damper and attached to the first structure; and
   wherein the plurality of second spacers are configured to allow the bolt to move within the penetration in a plane of the second structure, a first portion of the first structure is coplanar with a first portion of the second structure, the bolt is parallel to the plane of the first portion of the first structure and the first portion of the second structure, the second structure includes a first portion extending in a second plane that is perpendicular to a third plane of the second structure and a second portion extending in a fourth plane that is perpendicular to the third plane and the second plane, and a second damper is disposed in a penetration of the first portion of the second structure.

2. The apparatus of claim 1 wherein the circular damper comprises a circular structure.

3. The apparatus of claim 2 wherein the plurality of second spacers are disposed within the penetration of the circular structure.

4. The apparatus of claim 2 wherein the circular damper comprises a circular structure and the plurality of second spacers are disposed radially on the circular structure.

5. The apparatus of claim 2 wherein the plurality of second spacers are disposed axially within a penetration of the circular structure.

6. The apparatus of claim 1 wherein the first spacer is configured to support the second structure.

7. The apparatus of claim 1 wherein the circular damper comprises a circular structure having an outer radius.

8. The apparatus of claim 1 wherein the circular damper comprises a circular structure having an inner radius.

9. The apparatus of claim 1 wherein the damper comprises a circular structure having an outer radius and an inner radius.

10. The apparatus of claim 1 wherein the plurality of second spacers are disposed axially within an inner radius of the circular damper.

11. The apparatus of claim 1 wherein the plurality of second spacers are disposed axially within an inner radius of the penetration of the circular damper.

12. The apparatus of claim 1 wherein the first structure is coplanar with the second structure.

13. The apparatus of claim 1 wherein the first structure can move relative to the second structure.

14. The apparatus of claim 1 wherein a first portion of the first structure is coplanar with a first portion of the second structure.

15. The apparatus of claim 1 wherein a first portion of the first structure is coplanar with a first portion of the second structure and the bolt is parallel to the plane of the first portion of the first structure and perpendicular to a second portion of the second structure.

16. The apparatus of claim 1 further comprising a plurality of circular dampers disposed within a plurality of penetrations of the second structure, wherein the second structure fits within a first spacer of each of the plurality of circular dampers.

17. The apparatus of claim 1 wherein the circular damper comprises a circular structure having a plurality of outer radii.

18. An apparatus comprising:
   a first structure;
   a second structure;
   a circular damper disposed within a penetration of the second structure, wherein the second structure fits within a first spacer of the circular damper;

a plurality of second spacers disposed axially through a penetration of the circular damper and radially on the damper;
a bolt disposed in the penetration of the circular damper and attached to the first structure; and
wherein the plurality of spacers are configured to allow the bolt to move within the penetration in a plane of the second structure and a first portion of the first structure is coplanar with a first portion of the second structure and the bolt is parallel to the plane of the first portion of the first structure and perpendicular to a second portion of the second structure and the second structure includes a first portion extending in a second plane that is perpendicular to a third plane of the second structure and a second portion extending in a fourth plane that is perpendicular to the third plane and the second plane, a second circular damper disposed in a penetration of the first portion of the second structure and a third circular damper disposed in a penetration of the second portion of the second structure.

* * * * *